(12) United States Patent
Cho et al.

(10) Patent No.: US 11,511,317 B2
(45) Date of Patent: Nov. 29, 2022

(54) ELASTOMERIC ELECTRODE AND METHOD FOR PREPARING THE SAME

(71) Applicant: Korea University Research and Business Foundation, Seoul (KR)

(72) Inventors: Jinhan Cho, Seoul (KR); Seokmin Lee, Seoul (KR)

(73) Assignee: Korea University Research and Business Foundation, Seoul (KR)

(*) Notice: Subject to any disclaimer, the term of this patent is extended or adjusted under 35 U.S.C. 154(b) by 0 days.

(21) Appl. No.: 17/143,276

(22) Filed: Jan. 7, 2021

(65) Prior Publication Data
US 2021/0299700 A1  Sep. 30, 2021

(30) Foreign Application Priority Data
Mar. 25, 2020 (KR) .................. 10-2020-0036256

(51) Int. Cl.
| | |
|---|---|
| *B05D 3/10* | (2006.01) |
| *B05D 1/18* | (2006.01) |
| *C09D 1/00* | (2006.01) |
| *B05D 5/06* | (2006.01) |
| *B05D 7/00* | (2006.01) |
| *H02N 1/04* | (2006.01) |
| *B05D 7/02* | (2006.01) |
| *B82Y 30/00* | (2011.01) |

(52) U.S. Cl.
CPC .......... *B05D 3/101* (2013.01); *B05D 1/185* (2013.01); *B05D 5/062* (2013.01); *B05D 7/02* (2013.01); *B05D 7/52* (2013.01); *C09D 1/00* (2013.01); *H02N 1/04* (2013.01); *B05D 2201/02* (2013.01); *B05D 2350/30* (2013.01); *B82Y 30/00* (2013.01)

(58) Field of Classification Search
CPC ......... B05D 3/101; B05D 1/185; B05D 5/062
See application file for complete search history.

(56) References Cited

U.S. PATENT DOCUMENTS

| | | | |
|---|---|---|---|
| 2008/0277631 A1* | 11/2008 | Smela | H01B 1/22 252/518.1 |
| 2019/0279782 A1* | 9/2019 | Cho | H01B 1/02 |

FOREIGN PATENT DOCUMENTS

| | | | |
|---|---|---|---|
| KR | 10-2015-0072291 A | 6/2015 | |
| KR | 2018046529 A * | 5/2018 | ............... H01B 1/02 |
| KR | 10-1877681 B1 | 7/2018 | |

OTHER PUBLICATIONS

Lee, Seokmin, et al., "A Metal-Like Conductive Elastomer with a Hierarchical Wrinkled Structure", *Advanced Materials*, 32, 7, 2020 (pp. 1-10).

(Continued)

*Primary Examiner* — Dah-Wei D. Yuan
*Assistant Examiner* — Kristen A Dagenais-Englehart
(74) *Attorney, Agent, or Firm* — NSIP Law

(57) ABSTRACT

The elastomeric electrode includes: a stretchable substrate 10 having wrinkles formed on one surface thereof, the peaks C and valleys T of the wrinkles being repeated; a wrinkled metal nanoparticle layer 20 including metal nanoparticles 21 and formed by deposition of the metal nanoparticles along the wrinkles of the substrate 10; and a wrinkled monomolecular layer 30 including a monomolecular material having one or more amine groups ($-NH_2$) and formed by deposition of the monomolecular material onto the metal nanoparticle layer 20. Also disclosed is a method for preparing the elastomeric electrode.

3 Claims, 11 Drawing Sheets

(56) References Cited

OTHER PUBLICATIONS

Gao, Naiwei, et al. "Polymer Swelling Induced Conductive Wrinkles for an Ultrasensitive Pressure Sensor." ACS Macro Letters 5.7 (2016): 823-827.
Aufan, M. Rifqi, et al. "Facile Synthesis of Conductive Polypyrrole Wrinkle Topographies on Polydimethylsiloxane Via a Swelling-deswelling Process and Their potential Uses in Tissue Engineering." ACS Applied Materials & Interfaces 7.42 (2015): 23454-23463.
Korean Office Action dated Aug. 18, 2021, in counterpart Korean Patent Application No. 10-2020-0036256 (5 pages in Korean).
Korean Notice of Allowance dated May 13, 2022, in counterpart Korean Patent Application No. 10-2020-0036256 (3 pages in Korean).

\* cited by examiner

ELASTOMERIC ELECTRODE AND METHOD FOR PREPARING THE SAME

CROSS-REFERENCE TO RELATED APPLICATIONS

This application claims the benefit under 35 USC § 119(a) of Korean Patent Application No. 10-2020-0036256, filed on Mar. 25, 2020, in the Korean Intellectual Property Office, the entire disclosure of which is incorporated herein by reference for all purposes.

BACKGROUND OF THE INVENTION

1. Field of the Invention

The present invention relates to an elastomeric electrode and a method for preparing the same. More specifically, the present invention relates to a wrinkled elastomeric electrode including densely packed metal nanoparticles on an elastomer and a method for preparing the elastomeric electrode.

2. Description of the Related Art

In recent years, conventional rigid electronics have been replaced by wearable and skin-attachable electronics. Such next-generation electronics should be stably driven even under various deformations such as bending, stretching, and compression caused by the external environment. One of the most important techniques required for this stability is the preparation of stretchable electrodes that are stable and can maintain high electrical conductivity even under mechanical deformations.

Conventional stretchable electrodes have been fabricated through structural design of bulk metals to impart stretchability thereto but are limited in achieving high strain due to the intrinsic low stretchability of metals. Techniques for preparing composites of conductive materials (for example, carbon nanotubes) and stretchable elastomers have been developed but have difficulty in achieving high electrical conductivity. The reason for the low electrical conductivity of stretchable electrodes is due to the high contact resistance between neighboring conductive components or the intrinsically low conductivity of the carbon-based materials used. Although the contact resistance can be lowered by thermal annealing and/or strong mechanical pressing, the application of such treatments is limited to conditions that can maintain the physical and/or chemical properties of the elastomers. Unstable bonding between the conductive components and the elastomers causes cracking and delamination, leading to poor mechanical stability. Further, these techniques are difficult to apply to various shaped and large-area substrates.

Thus, there is an urgent need for solutions to the problems of conventional stretchable electrodes.

SUMMARY OF THE INVENTION

The present invention has been made in an effort to solve the problems of the prior art and one aspect of the present invention is to prepare an elastomeric electrode including densely packed metal nanoparticles coated on the surface of a stretchable wrinkled elastomer.

A further aspect of the present invention is to provide a method for preparing an elastomeric electrode by coating metal nanoparticles on an elastomer and inducing a wrinkled structure while allowing the elastomer to swell in an organic solvent.

An elastomeric electrode according to one embodiment of the present invention includes: a stretchable substrate having wrinkles formed on one surface thereof, the peaks and valleys of the wrinkles being repeated; a wrinkled metal nanoparticle layer including metal nanoparticles and formed by deposition of the metal nanoparticles along the wrinkles of the substrate; and a wrinkled monomolecular layer including a monomolecular material having one or more amine groups ($-NH_2$) and formed by deposition of the monomolecular material onto the metal nanoparticle layer.

In the elastomeric electrode, some surface ligands of the metal nanoparticles may be eliminated by exchange with functional groups on the one surface of the substrate.

In the elastomeric electrode, some of the uneliminated surface ligands of the metal nanoparticles may be eliminated by exchange with the amine groups of the monomolecular material.

In the elastomeric electrode, the substrate may be a poly(dimethylsiloxane) (PDMS) substrate functionalized with thiol groups (SH), the metal nanoparticles may be gold (Au) nanoparticles stabilized with tetraoctylammonium bromide (TB), and the monomolecular material may include one or more materials selected from the group consisting of tris(2-aminoethyl)amine (TA), diethylenetriamine (DETA), and hydrazine (Hyd).

In the elastomeric electrode, the metal nanoparticle layer and the monomolecular layer deposited onto the metal nanoparticle layer may form a wrinkled bilayer and the surface wrinkles of the bilayer may have a wavelength of 1.0 to 2.2 μm and an amplitude of 0.4 to 0.6 μm.

The elastomeric electrode may include a plurality of bilayers, each of which consists of the metal nanoparticle layer and the monomolecular layer deposited onto the metal nanoparticle layer.

A method for preparing an elastomeric electrode according to one embodiment of the present invention includes (a) dipping a stretchable substrate into a first dispersion including metal nanoparticles dispersed in a first organic solvent to swell the substrate and form a metal nanoparticle layer on the swollen substrate and (b) dipping the swollen substrate formed with the metal nanoparticle layer into a second dispersion including a monomolecular material having one or more amine groups ($-NH_2$) dispersed in a second organic solvent to form a monomolecular layer on the metal nanoparticle layer and contract the substrate, leaving wrinkles on the surface of a bilayer consisting of the metal nanoparticle layer and the monomolecular layer deposited onto the metal nanoparticle layer.

The substrate may be a poly(dimethylsiloxane) (PDMS) substrate, the first organic solvent may include toluene, and the second organic solvent may include ethanol.

Steps (a) and (b) may be sequentially repeated a plurality of times to deposit a plurality of bilayers.

The features and advantages of the present invention will become apparent from the following description with reference to the accompanying drawings.

Prior to the detailed description of the invention, it should be understood that the terms and words used in the specification and the claims are not to be construed as having common and dictionary meanings but are construed as having meanings and concepts corresponding to the technical spirit of the present invention in view of the principle that the inventor can define properly the concept of the terms and words in order to describe his/her invention with the best method.

The elastomeric electrode of the present invention can be imparted with high electrical conductivity by coating the surface of the stretchable elastomer with the metal nanoparticles in the organic solvent such that the particles are densely packed.

In addition, the elastomeric electrode of the present invention can be endowed with high mechanical stability and large surface area by coating the surface of the swollen elastomer with the metal nanoparticles in the organic solvent based on high bonding strength between the elastomer and the nanoparticles and inducing the formation of a wrinkled structure when the swollen elastomer returns to its initial size.

Furthermore, the method of the present invention is based on a simple solution process and can thus be applied to various shaped and large-area substrates.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Figure 1:
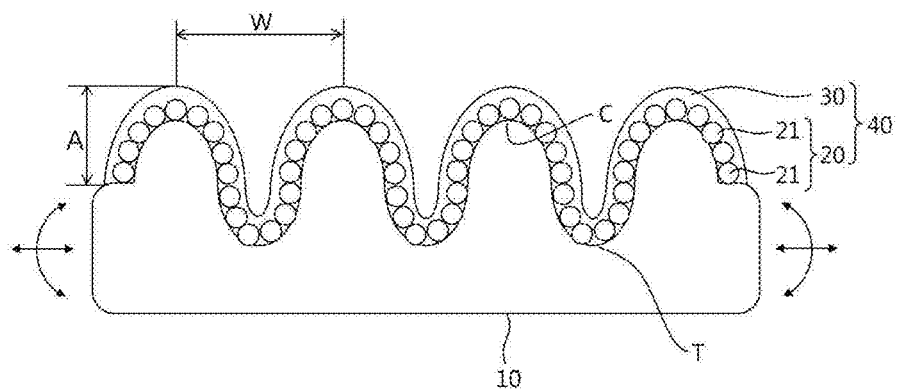
FIG. 1 is a cross-sectional view schematically illustrating an elastomeric electrode according to one embodiment of the present invention.

Other objects, advantages, and novel features of the invention will become more apparent from the following detailed description and preferred embodiments with reference to the appended drawings. In the drawings, the same elements are denoted by the same reference numerals even though they are depicted in different drawings. Although such terms as "first" and "second," etc. may be used to describe various elements, these elements should not be limited by above terms. These terms are used only to distinguish one element from another. In the description of the present invention, detailed explanations of related art are omitted when it is deemed that they may unnecessarily obscure the essence of the present invention.

Preferred embodiments of the present invention will now be described in detail with reference to the accompanying drawings.

FIG. 1 is a cross-sectional view schematically illustrating an elastomeric electrode according to one embodiment of the present invention.

As illustrated in FIG. 1, the elastomeric electrode includes a stretchable substrate 10 having wrinkles formed on one surface thereof, the peaks C and valleys T of the wrinkles being repeated; a wrinkled metal nanoparticle layer 20 including metal nanoparticles 21 and formed by deposition of the metal nanoparticles along the wrinkles of the substrate 10; and a wrinkled monomolecular layer 30 including a monomolecular material having one or more amine groups (—NH$_2$) and formed by deposition of the monomolecular material onto the metal nanoparticle layer 20.

The present invention is directed to an elastomeric electrode that can maintain metal-like electrical conductivity that is stable even under repeated mechanical deformations such as bending, stretching, and compression. With the advent of next-generation wearable or skin-attachable electronics, there has been growing interest in stretchable electrodes that are stable and can maintain high electrical conductivity even under mechanical deformations. Conventional stretchable electrodes have been fabricated through structural design of bulk metals to impart stretchability thereto or from composites of carbon-based conductive materials and elastomers. However, conventional stretchable electrodes cannot achieve high strain due to the intrinsic low stretchability of the metals, cannot achieve high electrical conductivity due to the high contact resistance between the conductive components or the intrinsically low electrical conductivity of the carbon-based materials used, suffer from poor mechanical stability due to unstable bonding between the conductive components and the elastomers, and have difficulty in applying to various shaped and large-area substrates. The present invention has been made in an effort to provide solutions to the problems of conventional stretchable electrodes.

Specifically, an elastomeric electrode according to one embodiment of the present invention includes a substrate 10, a metal nanoparticle layer 20, and a monomolecular layer 30.

Here, the substrate 10 is a support member that supports the metal nanoparticle layer 20 and the monomolecular layer 30. Due to its stretchability, the substrate 10 is deformed (for example, bent, stretched or twisted) when an external force is applied thereto and can return to its initial shape when the external force is removed. For example, a highly stretchable poly(dimethylsiloxane) (PDMS) substrate may be mentioned as the stretchable substrate 10. However, the material for the substrate 10 is not necessarily limited to PDMS. Any stretchable material may be used for the substrate 10 without particular limitation as long as it can form surface wrinkles by a method for preparing the elastomeric electrode, which is described below.

A wrinkled structure is formed on at least one surface of the substrate 10. A plurality of peaks C having a predetermined height and a plurality of valleys T having a predetermined depth are repeated in the wrinkled structure. The peaks C and the valleys T are arranged in a zigzag pattern along the lengthwise direction. Alternatively, the peaks C and the valleys T may be randomly oriented. The distance (i.e., wavelength) between the adjacent peaks C and/or the height (i.e., amplitude) of the peaks C can be maintained constant.

The metal nanoparticle layer 20 is deposited onto the wrinkled surface of the substrate 10. The surface of the substrate 10 may be modified with functional groups that can be exchanged with surface ligands of metal nanoparticles 21 to induce stable bonding at the interface between the substrate 10 and the metal nanoparticle layer 20. The metal nanoparticle layer 20 is formed by coating of the metal nanoparticles 21 along the surface wrinkles of the substrate 10. Accordingly, the metal nanoparticle layer 20 has wrinkles corresponding to the surface wrinkles of the substrate 10. Here, some of the surface ligands of the metal nanoparticles 21 may be exchanged with functional groups of the surface-modified substrate 10. The metal nanoparticle layer 20 can be formed by a solution process. In this case, the metal nanoparticles 21 are arranged in the form of a thin film on the substrate 10. For example, the metal nanoparticles 21 may be gold nanoparticles (Au NPs). The gold nanoparticles may be stabilized with tetraoctylammonium bromide (TB) during synthesis. The use of the substrate 10 functionalized with thiol groups (—SH) allows some of the TB ligands of the gold nanoparticles to be eliminated by exchange with the thiol groups.

The monomolecular layer 30 is deposited onto the metal nanoparticle layer 20 and includes a monomolecular material having one or more amine groups. The monomolecular layer 30 is formed by coating the monomolecular material on the outer surface of the metal nanoparticle layer 20 by layer-by-layer (LBL) assembly based on a solution process. Bulk metals have low electrical resistance, but metal films composed of metal particles have insulating properties when the surface of the metal particles is surrounded by long organic ligands. For example, thin films composed of gold nanoparticles surface capped with TB ligands have very low electrical conductivity. Thus, in the present invention, the monomolecular material having amine groups is coated on the metal nanoparticle layer 20, and as a result, some of the insulating surface ligands of the metal nanoparticles 21 that remain unexchanged with functional groups of the substrate 10 can be eliminated by exchange with the amine groups of the monomolecular material. The metal nanoparticle layer 20 and the monomolecular layer 30 deposited onto the metal nanoparticle layer 20 form a bilayer 40 and the consecutive ligand-exchange reactions between the metal nanoparticles 21 and the monomolecular material decreases the contact resistance between the neighboring metal nanoparticles 21, allowing the bilayer 40 to have high electrical conductivity.

The monomolecular material acts as a linker and may include one or more materials selected from the group consisting of, but not necessarily limited to, tris(2-aminoethyl)amine (TA), diethylenetriamine (DETA), and hydrazine (Hyd).

The monomolecular layer 30 coated on the wrinkled metal nanoparticle layer 20 may have wrinkles corresponding to those of the underlying metal nanoparticle layer 20. As a consequence, the bilayer 40 coated on the substrate 10 may have surface wrinkles. Here, the surface wrinkles of the bilayer 40 may have a wavelength (W) of 1.0 to 2.2 μm and an amplitude (A) of 0.4 to 0.6 μm.

In conclusion, the ligand exchange between the stretchable substrate 10 and the metal nanoparticle layer 20 induces the formation of stable interfacial bonds, the ligand exchange between the metal nanoparticle layer 20 and the monomolecular layer 30 imparts metal-like high electrical conductivity, and mechanical stresses are focused on the peaks C in the wrinkled structure, with the result that exceptional electrical performance of the elastomeric electrode can be stably maintained without delamination between the substrate 10 and the bilayer 40 and cracking of the bilayer 40 even under external mechanical stimuli.

Figure 2:
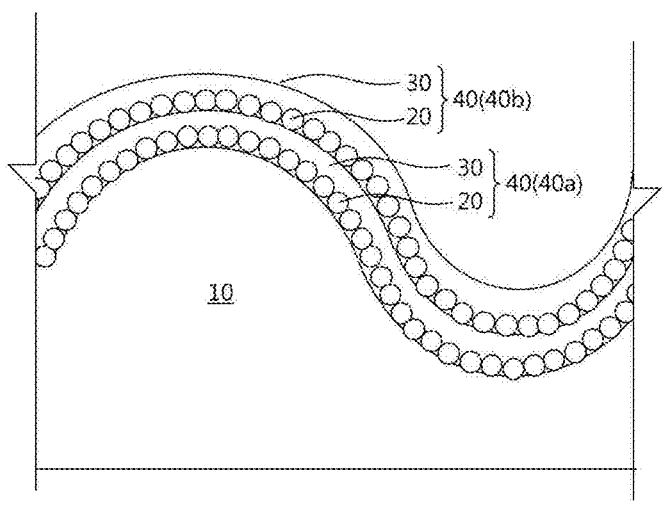
FIG. 2 is a cross-sectional view schematically illustrating an elastomeric electrode according to a further embodiment of the present invention.

FIG. 2 is a cross-sectional view schematically illustrating an elastomeric electrode according to a further embodiment of the present invention.

Referring to FIG. 2, the elastomeric electrode includes a plurality of bilayers 40, each of which consists of a metal nanoparticle layer 20 and a monomolecular layer 30 deposited onto the metal nanoparticle layer 20. That is, a first bilayer 40a consisting of a wrinkled metal nanoparticle layer and a monomolecular layer is coated on a substrate 10 and a second bilayer 40b consisting of another wrinkled metal nanoparticle layer and another monomolecular layer is deposited onto the first bilayer 40a. As the number of the bilayers 40 increases, the density of metal nanoparticles 21 packed on the substrate 10 per unit area increases and partial metallic fusion occurs among the metal nanoparticles 21, leading to higher electrical conductivity of the elastomeric electrode.

A description will be given concerning a method for preparing an elastomeric electrode according to a further embodiment of the present invention. The elastomeric electrode is the same as that described above and a repeated explanation thereof is omitted or simplified in this description.

Figure 3:
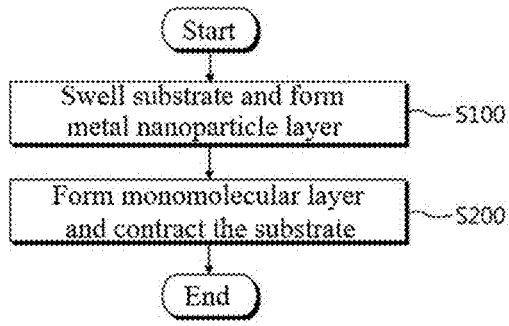
FIG. 3 is a flowchart illustrating a method for preparing an elastomeric electrode according to one embodiment of the present invention.

FIG. 3 is a flowchart illustrating a method for preparing an elastomeric electrode according to one embodiment of the present invention.

As illustrated in FIG. 3, the method includes (a) dipping a stretchable substrate into a first dispersion including metal nanoparticles dispersed in a first organic solvent to swell the substrate and form a metal nanoparticle layer on the swollen substrate (S100) and (b) dipping the swollen substrate formed with the metal nanoparticle layer into a second dispersion including a monomolecular material having one or more amine groups (—$NH_2$) dispersed in a second organic solvent to form a monomolecular layer on the metal nanoparticle layer and contract the substrate, leaving wrinkles on the surface of a bilayer consisting of the metal nanoparticle layer and the monomolecular layer deposited onto the metal nanoparticle layer (S200).

Wrinkled elastomeric electrodes can be prepared through metal deposition onto prestrained elastomeric substrates in uniaxial or biaxial direction. However, these elastomeric electrodes cannot maintain high electrical conductivity under mechanical strain, experiencing cracking/disconnection of the continuous metallic thin layer as well as delamination between the elastomeric substrate and the metallic thin layer. Additionally, such preparation processes have difficulty in applying to large-area substrates. Although these elastomeric electrodes can also be prepared through the transfer or deposition of conductive materials such as metal nanowires or carbon nanotubes onto prestrained elastomer substrates, the abovementioned problems still represent major hurdles to fabricating elastomeric electrodes with high and stable electrical conductivity under various mechanical stimuli. Further, the previously reported processes are not suitable for the preparation of electrodes with arbitrary shapes such as curved structure. Thus, the present invention is aimed at fabricating a wrinkled elastomeric electrode of a desired shape with stable and high electrical conductivity.

Although the high contact resistance between neighboring conductive components in existing elastomeric electrodes can be lowered by thermal annealing and/or strong mechanical pressing, the application of such treatments is limited to conditions that can maintain the physical and chemical properties of elastomeric substrates. In contrast, according to the present invention, metal components can be stably adsorbed onto an elastomer by a solution process without requiring the step of prestraining the elastomer and the contact resistance between the metal components can be minimized without additional treatments, such as annealing or mechanical pressing. The method of the present invention enables the preparation of a wrinkled elastomeric electrode with bulk metal-like electrical conductivity, high electrical stability, and a large surface area without the need for additional treatment by solvent swelling of the elastomer and coating of metal nanoparticles.

Specifically, a method for preparing an elastomeric electrode according to one embodiment of the present invention includes first substrate dipping (S100) and second substrate dipping (S200).

In S100, a stretchable substrate is dipped into a first dispersion. The first dispersion is a solution including metal nanoparticles dispersed in a first organic solvent and the stretchable substrate tends to swell in the first organic solvent. Thus, when the substrate is dipped into the first dispersion, the substrate swells and simultaneously metal nanoparticles are coated on the swollen substrate to form a metal nanoparticle layer. The surface of the substrate may be modified with functional groups that can be exchanged with surface ligands of the metal nanoparticles 21. In one embodiment, gold nanoparticles may be dispersed in toluene to prepare a first dispersion and a poly(dimethylsiloxane) (PDMS) substrate surface modified with thiol groups (—SH) may be dipped in the first dispersion. However, the first organic solvent is not limited to toluene, the metal nanoparticles are not limited to gold nanoparticles, and the substrate is not limited to a PDMS substrate functionalized with thiol groups.

In S200, the swollen substrate formed with the metal nanoparticle layer is dipped into a second dispersion. The second dispersion is a solution including a monomolecular material having one or more amine groups dispersed in a second organic solvent. When the substrate is dipped into the second dispersion, a monomolecular layer is formed on the metal nanoparticle layer by layer-by-layer (LBL) assembly. At this time, some of the surface ligands of the metal nanoparticles that remain uneliminated by the functional groups of the substrate are eliminated by exchange with the amine groups of the monomolecular material. The substrate is contracted in the second organic solvent. During contraction of the substrate, a bilayer consisting of the metal nanoparticle layer and the monomolecular layer coated on the substrate is also contracted, leaving wrinkles on the surface of the substrate. In one embodiment, the second organic solvent may be ethanol in which the swollen PDMS substrate tends to contract. However, the second organic solvent is not necessarily limited to ethanol. After all, the substrate, the first organic solvent, and the second organic solvent can be appropriately selected as long as the substrate swells in the first organic solvent, the swollen substrate is contracted in the second organic solvent, and a wrinkled structure can be formed according to the swelling-contraction mechanism.

S100 and S200 may be sequentially repeated a plurality of times to form multibilayers.

Overall, the elastomeric electrode of the present invention can be imparted with high electrical conductivity by coating the surface of the stretchable elastomer with the metal nanoparticles in the organic solvent such that the particles are densely packed. In addition, the elastomeric electrode of the present invention can be endowed with high mechanical stability and large surface area by coating the surface of the swollen elastomer with the metal nanoparticles in the organic solvent based on high bonding strength between the elastomer and the nanoparticles and inducing the formation of a wrinkled structure when the swollen elastomer returns to its initial size. Furthermore, the method of the present invention is based on a simple solution process and can thus be applied to various shaped and large-area substrates.

The present invention will be more specifically explained with reference to the following experimental examples.

1. Preparation of Wrinkled Elastomeric Electrodes

Figure 4:
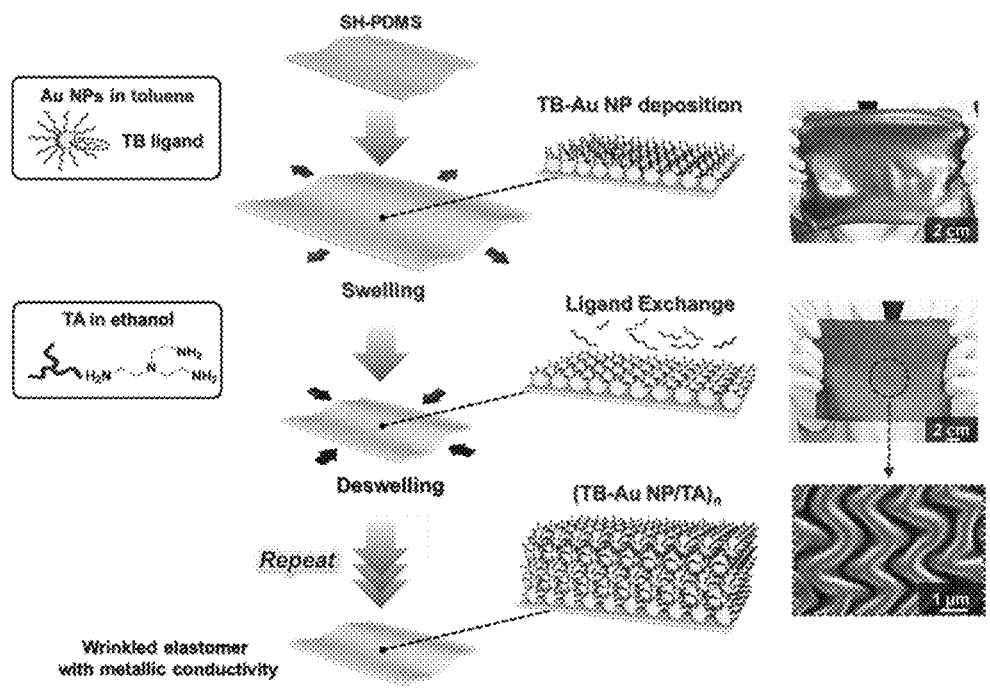
FIG. 4 is a schematic diagram illustrating a method for fabricating wrinkled (TB-Au NP/TA)$_n$-PDMS elastomeric electrodes in which (TB-Au NP/TA)$_n$ multibilayers were deposited onto a PDMS substrate (Experimental Example 1)

FIG. 4 is a schematic diagram illustrating a method for fabricating wrinkled (TB-Au NP/TA)$_n$-PDMS elastomeric electrodes in which (TB-Au NP/TA)$_n$ multibilayers were deposited onto a PDMS substrate. Referring to FIG. 4, TB-stabilized gold nanoparticles (TB-Au NPs) with a diameter of 4-10 nm were dispersed in toluene to prepare a solution of the gold nanoparticles. A PDMS substrate functionalized with thiol groups (—SH) was dipped into the gold nanoparticle solution. At this time, the PDMS substrate swelled, TB-Au NPs were deposited onto the swollen PDMS substrate, and some of the surface TB ligands of the Au NPs were exchanged with the thiol groups of the PDMS. Thereafter, the TB-Au NP-deposited PDMS substrate was dipped into a solution containing tris(2-aminoethyl)amine (TA) as a monomolecular material dispersed in ethanol. At this time, the swollen PDMS substrate deswelled, and at the same time, the TB-Au NPs were layer-by-layer (LBL) assembled with TA. Here, some of the surface TB ligands of the Au NPs were replaced by the amine groups of the TA linkers. This ligand exchange takes place because the amine group of TA linker has a higher affinity (by covalent bonding) for the surface of the Au NPs than the ammonium groups of the TB ligands.

The above procedure was repeated to prepare a wrinkled elastomeric electrode having n bilayers (where n is a natural number of 2 or more), each of which consisted of the metal nanoparticle layer and the monomolecular layer.

Figure 5:
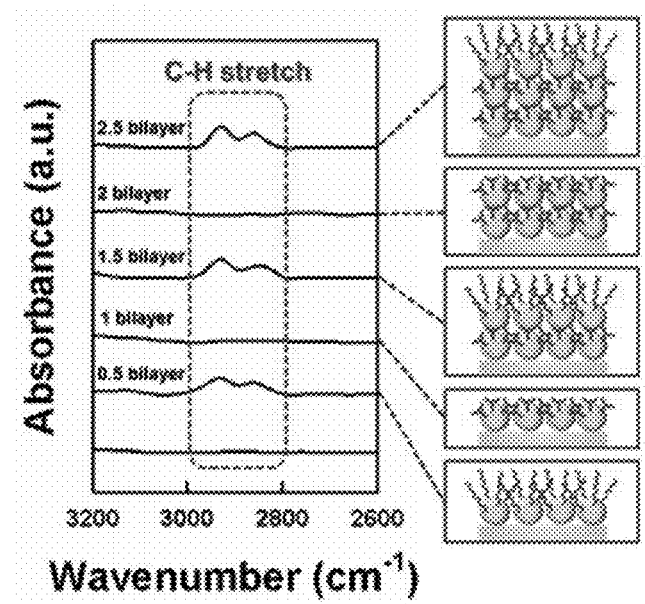
FIG. 5 shows Fourier transform infrared (FTIR) spectra of (TB-Au NP/TA)$_n$ multibilayers (Experimental Example 2)

2. Analysis of Structures of (TB-Au NP/TA)$_n$ Multi Bilayers of Elastomeric Electrodes FIG. 5 shows Fourier transform infrared (FTIR) spectra of (TB-Au NP/TA)$_n$ multibilayers. Referring to FIG. 5, the sequential repeated deposition of TB-Au NPs and TA almost completely eliminated the TB ligands bound to the surface of the Au NPs (see the repeated generation and disappearance of the C—H stretching peaks). These FTIR results imply that vertically adjacent Au NPs within multibilayers are connected by only one TA layer without TB ligands.

Figure 6:
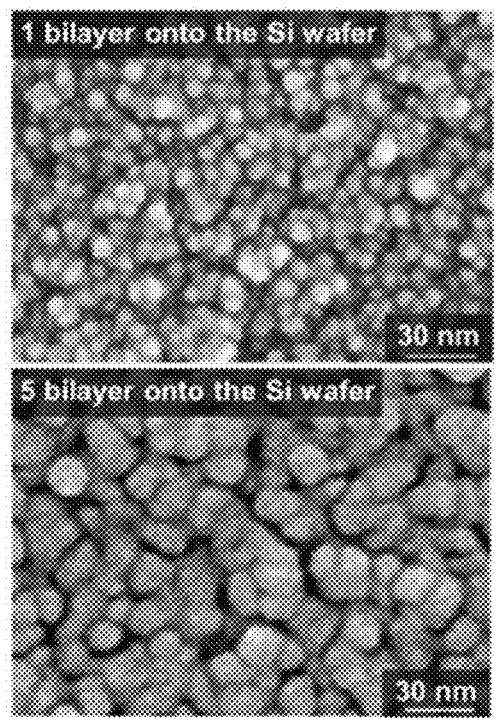
FIG. 6 shows field-emission scanning electron microscopy (FE-SEM) images of wrinkled (TB-Au NP/TA)$_n$ multibilayers (n=1 and 5) (Experimental Example 2)

This close packing can be confirmed by field-emission scanning electron microscopy (FE-SEM). FIG. 6 shows field-emission scanning electron microscopy (FE-SEM) images of wrinkled (TB-Au NP/TA)$_n$ multibilayers (n=1 and 5). As shown in FIG. 6, the five-bilayered film exhibited a partially fused morphology with large grain boundaries instead of spherical Au NPs with a diameter of 4-10 nm, which can be seen in the one-bilayer film. Therefore, the approach of the present invention minimizes the separation distance (and thus contact resistance) between neighboring Au NPs and leads to partial metallic fusion, without the need for any additional treatment. These phenomena were more evidently observed when the amine-functionalized diethylenetriamine (Mw≈104) with lower Mw than that of TA (Mw≈146) was used as an organic linker. On the other hand, the use of bulky polymer linkers (e.g., poly(ethylene imine) (PEI)) with high Mw (≈50 000) effectively hindered metallic fusion between neighboring Au NPs.

Figure 7:
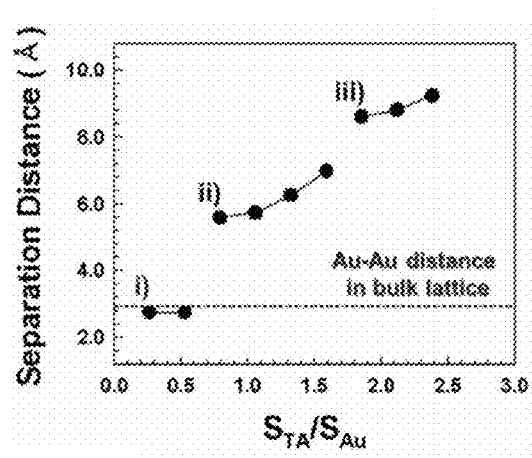
FIG. 7 is a graph showing the separation distance between vertically adjacent Au NPs within (TB-Au NP/TA)$_n$ multibilayers (Experimental Example 2)
Figure 7:
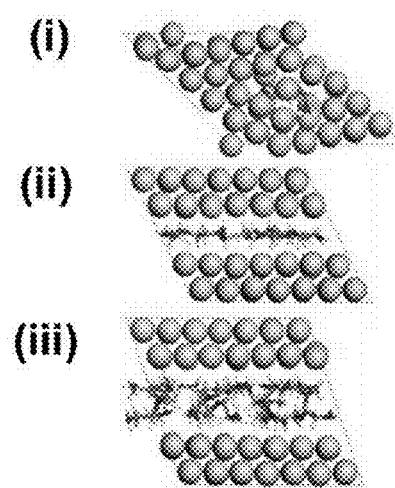

FIG. 7 is a graph showing the separation distance between vertically adjacent Au NPs within (TB-Au NP/TA)$_n$ multibilayers. In order to calculate the separation distance between vertically adjacent Au NPs within multilayers, atomistic molecular dynamics simulations of model systems for TA between gold nanoparticle layers were used. When the ratio of the surface area occupied by adsorbed TA linkers to that occupied by adsorbed Au NPs ($S_{TA}/S_{Au}$) is approximately unity ((ii) of FIG. 7) and therefore the Au NPs are covered by a TA monolayer adopting a flat conformation, the separation distance between vertically adjacent Au NPs was estimated to be ≈5.6-5.7 Å. This minimized interparticle distance between neighboring Au NPs with low cohesive energy (3.81 eV per atom) can facilitate reciprocal atom diffusion within the layer-by-layer (LBL)-assembled Au NPs, which can have a positive effect on the enhancement of the electrical conductivity.

The total thickness of (TB-Au NP/TA)$_n$ multilayer films adsorbed onto PDMS was investigated. Although the thickness of the one-bilayer film (i.e., (TB-Au NP/TA)$_1$) was ≈98 nm, the average bilayer thickness of the TB-Au NP/TA multibilayers was ≈13 nm. That is, when the PDMS substrate was dipped into the TB-Au NP-toluene solution for the formation of the first Au NP layer, the TB-Au NPs were densely packed onto the swollen PDMS substrates because there was no repulsion force among neighboring NPs. This is in contrast with conventional electrostatic layer-by-layer assembly of charged NPs in aqueous media, which generates a low packing density (<30%). Indeed, when anionic Au NP/cationic TA multibilayers were deposited onto the PDMS substrate, the formed Au NP arrays exhibited low surface coverage without metallic fusion. The one-bilayer film (i.e., (TB-Au NP/TA)$_1$) on the PDMS substrate exhibited a plane-strain modulus of ≈133 MPa which is much lower than that of a previously reported 100-nm-thick Au film (≈53 GPa) and a bulk Au thin film (82 GPa). This result implies that the TB-Au NP-coated PDMS substrate can significantly lower the probability of fracture or delamination of Au NP arrays on the PDMS substrate under external mechanical stimuli. In addition, it was observed that the stretchability of the (TB-Au NP/TA)$_n$ multibilayers coated on the PDMS substrate in dried state was decreased compared to that of bare PDMS. That is, the stretchability of the (TB-Au NP/TA)$_n$ multibilayers coated on the PDMS substrate strongly depends on the mechanical property of the adsorbed Au NP multibilayers.

3. Evaluation of Wrinkled Structures of Elastomeric Electrodes

Figure 8:
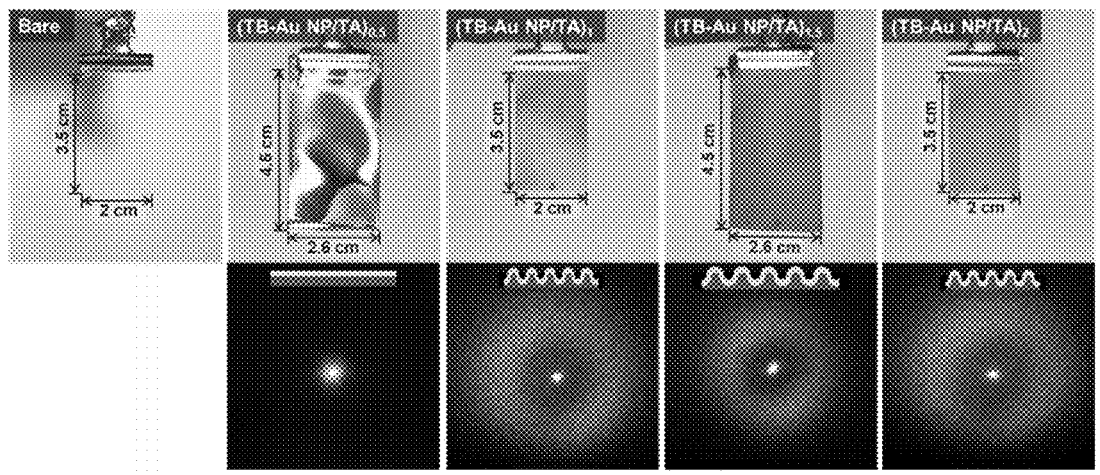
FIG. 8 shows photographic images and laser diffraction pattern images of wrinkled (TB-Au NP/TA)$_n$ multibilayers (Experimental Example 3)

FIG. 8 shows photographic images and laser diffraction pattern images of wrinkled (TB-Au NP/TA)$_n$ multibilayers. The surface topologies of (TB-Au NP/TA)$_n$-PDMS elastomeric electrodes (n=0.5, 1, 1.5, and 2) were examined during each LBL deposition cycle from photographs and light diffraction patterns obtained from the reflection setup. Here, n=0.5 represents a state in which only the TB-Au NP layer was deposited onto the PDMS substrate and n=1.5 represents a state in which one TB-Au NP layer was deposited onto the one-bilayer film (TB-Au NP/TA).

The (TB-Au NP/TA)$_{0.5}$-PDMS displayed a metallic yellowish color and swollen state. The lateral size of the PDMS substrate increased up to ≈130% (i.e., 3.5 to 4.5 cm) relative to the initial length of the pristine PDMS substrate. In this case, the light diffraction pattern displayed a single central spot. These observations indicate that densely packed Au NP layers were uniformly formed on the swollen PDMS substrate, inducing strong reflection.

When the swollen (TB-Au NP/TA)$_{0.5}$-PDMS was dipped into the TA-ethanol solution for TA deposition, the swollen PDMS substrate returned to its initial size due to the deswelling in ethanol. At this time, the PDMS substrate undergoes a strong compressive force (particularly lateral compressive force), and as a result, the swollen PDMS substrate is contracted, resulting in the formation of a wrinkled surface structure. After ligand exchange deposition of TA and deswelling, the surface of the (TB-Au NP/TA)$_1$ coated on the PDMS substrate exhibited a hazy and yellowish color owing to the formation of microwrinkles. The diffraction pattern displayed rings originating from the periodic formation of surface wrinkles in random orientations. This observation leads to the conclusion that the packing density of the TB-Au NPs is further increased upon PDMS substrate contraction and TA deposition.

Although the deposition of the next TB-Au NP layer causes the PDMS substrate to reswell, the preadsorbed Au NP layers with high packing density effectively hindered the morphological change to a smooth surface. More specifically, when the TB-Au NPs were coated on the TA-coated substrate, the length of the (TB-Au NP/TA)$_{1.5}$-PDMS again increased. In addition, the presence of the ring-shaped diffraction pattern and its decrease in diameter indicate that the surface wrinkles were expanded, maintaining random orientation.

The swelling-contraction phenomenon repeated after further deposition of TA and TB-Au NPs. These results were confirmed by reversible shifts in the peaks of the intensity profile obtained from the diffraction patterns.

Figure 9:
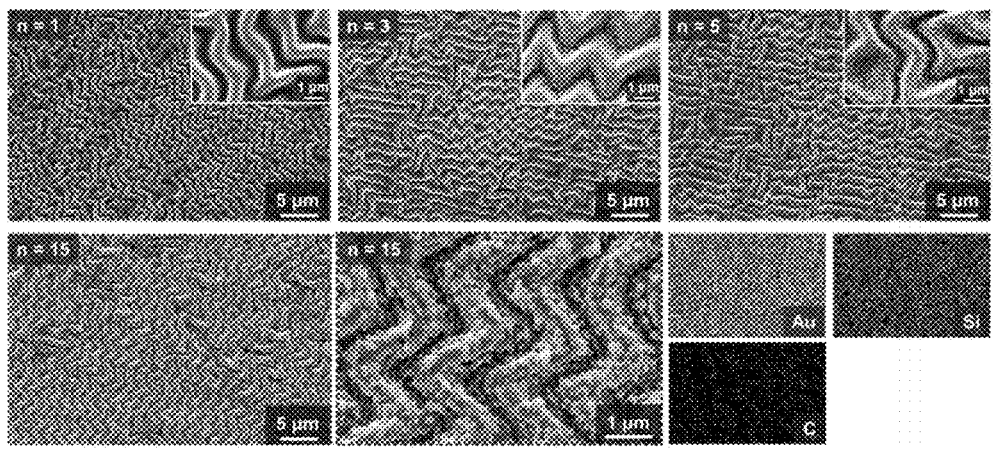
FIG. 9 shows field-emission scanning electron microscopy (FE-SEM) and energy dispersive X-ray spectroscopy (EDX) images of wrinkled (TB-Au NP/TA)$_n$, PDMS elastomeric electrodes in the dried state after the deposition of (TB-Au NP/TA)$_n$ multibilayers (Experimental Example 3)
Figure 10:
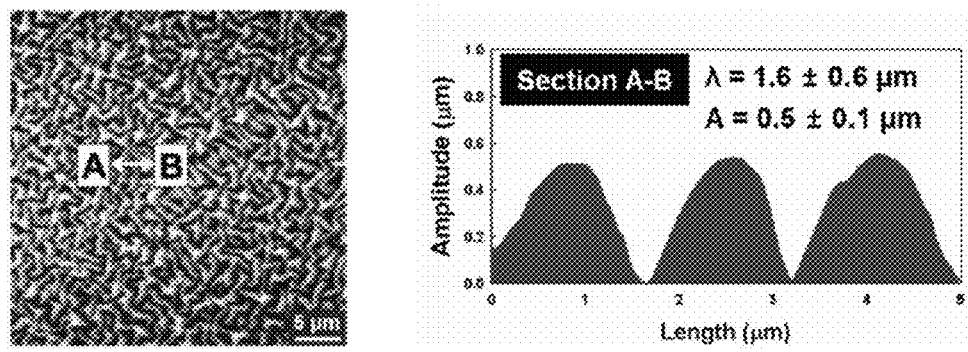
FIG. 10 shows an atomic force microscopy (AFM) image of a wrinkled (TB-Au NP/TA)$_i$-PDMS elastomeric electrode and its cross-sectional profile (Experimental Example 3)

FIG. 9 shows field-emission scanning electron microscopy (FE-SEM) and energy dispersive X-ray spectroscopy (EDX) images of wrinkled (TB-Au NP/TA)$_n$-PDMS elastomeric electrodes in the dried state after the deposition of (TB-Au NP/TA)$_n$ multibilayers and FIG. 10 shows an atomic force microscopy (AFM) of a wrinkled (TB-Au NP/TA)$_1$-PDMS elastomeric electrode and its cross-sectional profile.

To complement the results of the optical analysis above, the surface morphologies of (TB-Au NP/TA)$_n$ coated on PDMS in a dried state were observed using field-emission scanning electron microscopy (FE-SEM) and atomic force microscopy (AFM). Referring to FIG. 9, isotropically wrinkled surface patterns were formed on the surfaces of (TB-Au NP/TA)$_n$ multibilayers deposited onto the 500-μm-thick PDMS substrates. In particular, these wrinkled structures were formed after deposition of the first bilayer of TB-Au NP/TA, which exactly coincided with the optical images shown in FIG. 8.

Referring to FIG. 10, the wavelength and amplitude of the formed surface wrinkling were measured to be ≈1.6±0.6 μm and 0.5±0.1 μm, respectively. The wavelength was almost fixed after deposition of the first TB-Au NP bilayer despite the gradual increase in the (TB-Au NP/TA)$_n$ multibilayer thickness with increasing bilayer number. However, when the thickness of the PDMS substrate was 100 μm, the wavelength of the surface wrinkling was increased up to 3.4±0.6 μm (amplitude 1.1±0.1 μm) by the decreased compressive force.

Figure 11:
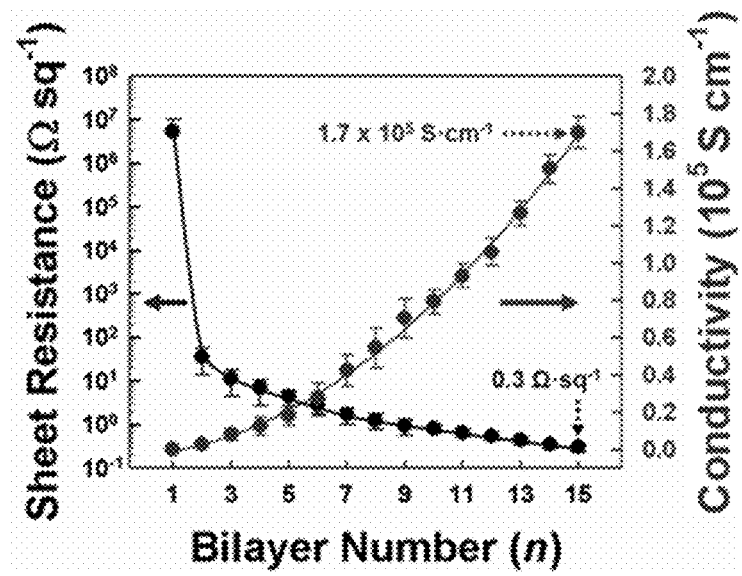
FIG. 11 shows the sheet resistances and electrical conductivities of wrinkled elastomeric electrodes as a function of bilayer number (n) (Experimental Example 4)

4. Evaluation of Electrical Conductivity and Mechanical Stability of Elastomeric Electrodes FIG. 11 shows the sheet resistances and electrical conductivities of wrinkled elastomeric electrodes as a function of bilayer number (n). The electrical conductivity and sheet resistance of the (TB-Au NP/TA)$_n$ multibilayers on PDMS substrates were investigated. Referring to FIG. 11, as the bilayer number (n) increased from 1 to 15, the electrical conductivity of (TB-Au NP/TA)$_n$ multibilayers significantly increased from ≈0.02 to 1.7×10$^5$ S/cm and the sheet resistance decreased from ≈10$^7$ to 0.3 Ω/sq.

Figure 12:
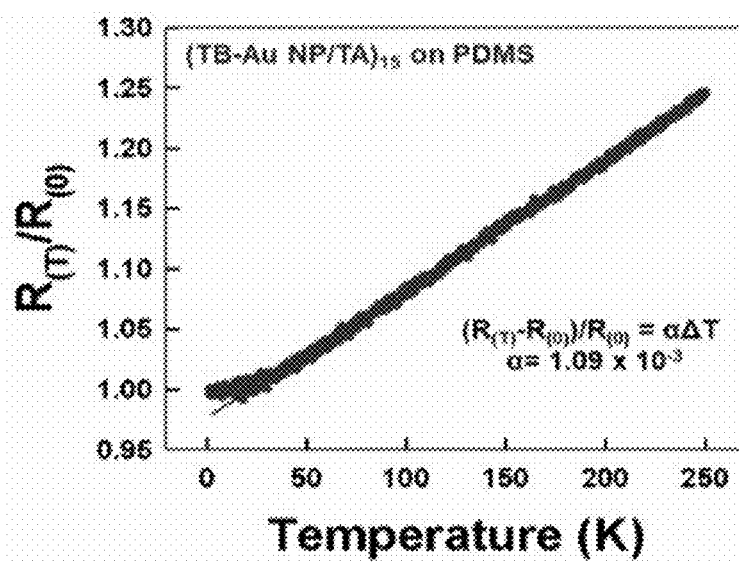
FIG. 12 shows a resistance change (R(T)/R(o)) as a function of temperature for a wrinkled (TB-Au NP/TA)$_{15}$-PDMS elastomeric electrode (Experimental Example 4)

In particular, the (TB-Au NP/TA)$_{15}$-coated PDMS film exhibited typical metallic conduction behavior instead of the semiconducting behavior shown in electron hopping or tunneling conduction. FIG. 12 shows a resistance change ($R_{(T)}/R_{(0)}$) as a function of temperature for the wrinkled (TB-Au NP/TA)$_{15}$-PDMS elastomeric electrode. Referring to FIG. 12, the resistivity of the (TB-Au NP/TA)$_{15}$ decreased linearly as the temperature decreased from 300 to 2 K, implying typical metallic conduction behavior. In this case, the multibilayer film coated on the PDMS substrate exhibited a temperature coefficient of 1.09×10$^{-3}$ K$^{-1}$, as obtained from the equation $\Delta R(T)/R(0)=\alpha \Delta T$, where R(T) is the resistance at temperature T, R(0) is the resistance at T=2 K, and α is the temperature coefficient. This measured temperature coefficient is similar to the characteristic of a bulk metal; for comparison, 3.71×10$^{-3}$ K$^{-1}$ is the temperature coefficient for bulk Au.

Figure 13:
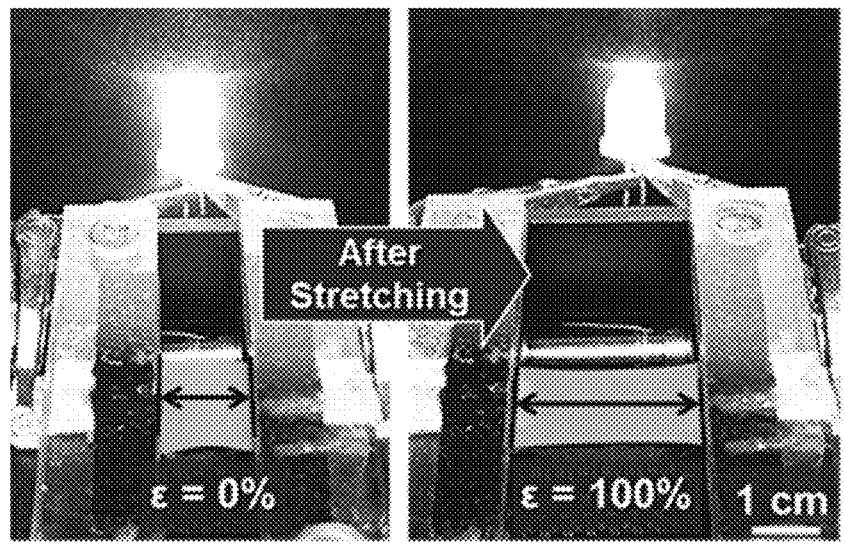
FIG. 13 shows photographs of a wrinkled (TB-Au NP/TA)$_n$-PDMS elastomeric electrode connected with LEDs before and after stretching (Experimental Example 4)
Figure 14:
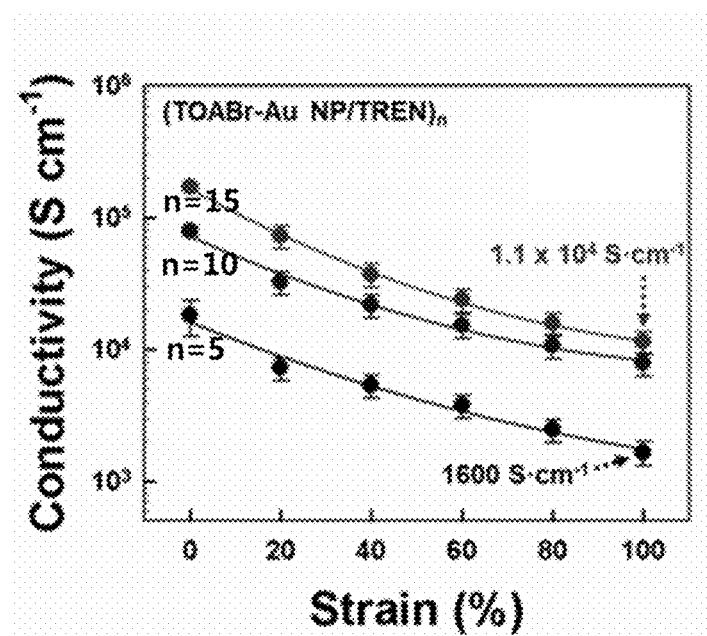
FIG. 14 shows the electrical conductivities as a function of strain for wrinkled (TB-Au NP/TA)$_n$-PDMS elastomeric electrodes (Experimental Example 4)
Figure 15:
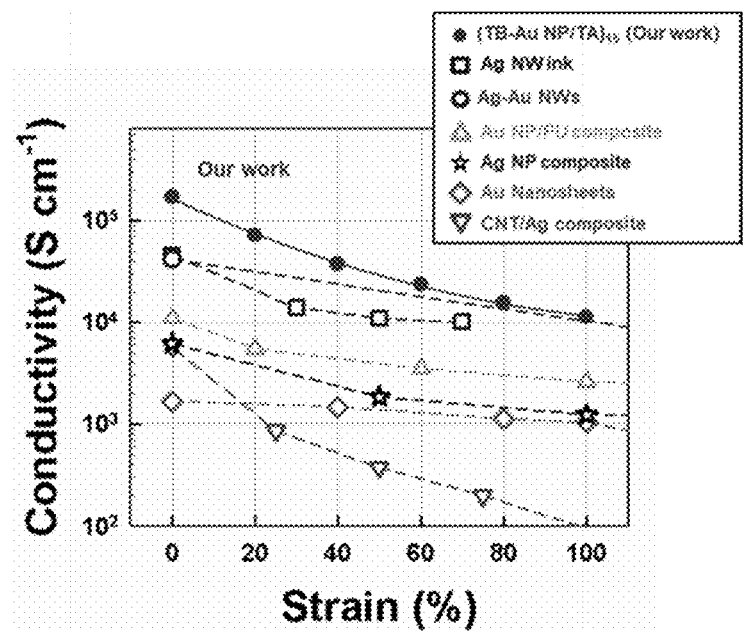
FIG. 15 is a graph comparing an inventive wrinkled (TB-Au NP/TA)$_{15}$-PDMS elastomeric electrode with previously reported elastomeric electrodes based on strain-dependent electrical conductivity (Experimental Example 4)

FIG. 13 shows photographs of a wrinkled (TB-Au NP/TA)$_n$-PDMS elastomeric electrode connected with LEDs before and after stretching, FIG. 14 shows the electrical conductivities as a function of strain for wrinkled (TB-Au NP/TA)$_n$-PDMS elastomeric electrodes, and FIG. 15 is a graph comparing a wrinkled (TB-Au NP/TA)$_{15}$-PDMS elastomeric electrode with previously reported elastomeric electrodes based on strain-dependent electrical conductivity.

Referring to FIGS. 13 and 14, the (TB-Au NP/TA)$_n$ (n=5, 10, 15) multibilayers exhibited highly stable electrical conductivity under external strain. In particular, even after 100% stretching of the (TB-Au NP/TA)$_{15}$ coated on PDMS, its electrical conductivity was ≈1.1×10$^4$ S/cm (see FIG. 14), which was superior to previously reported conductive materials (see FIG. 15).

It was also confirmed that this electrical conductivity could be maintained during repetitive strain tests (at least 2000 cycles). Furthermore, the mechanical stability of (TB-Au NP/TA)$_{15}$-coated PDMS was investigated under other types of mechanical deformation, namely, bending and normal compression. In the case of the bending test, the electrical resistance increased up to ≈110% of the initial resistance as the radius of curvature decreased from 16 mm to 2 mm; increasing the normal compression force from 0 to 200 N had no meaningful effect on the electrical resistance.

5. Preparation of Helical-Structured Elastomeric Electrode

Figure 16:
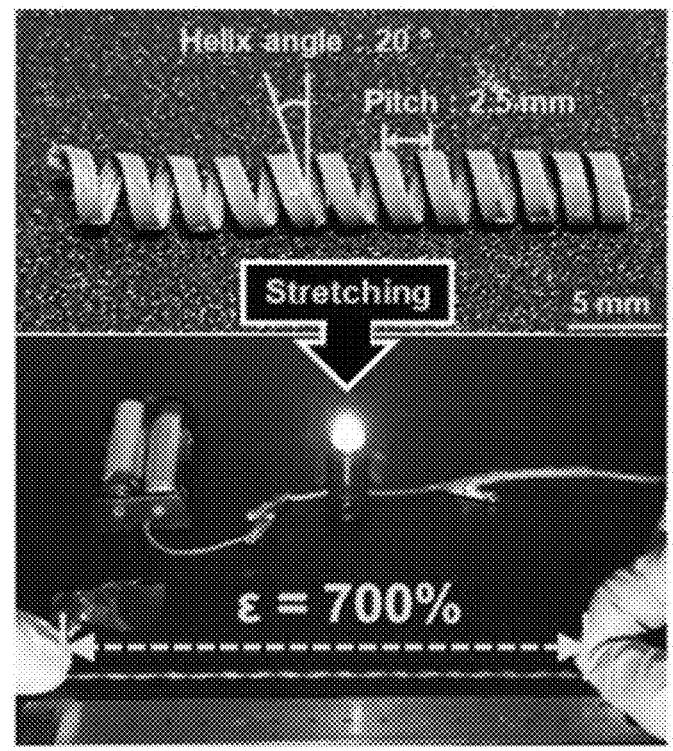
FIG. 16 shows photographs of a helical-structured (TB-Au NP/TA)$_{15}$-PDMS elastomeric electrode with an LED connection before and after the application of 700% strain (Experimental Example 5)

FIG. 16 shows photographs of a helical-structured (TB-Au NP/TA)$_{15}$-PDMS elastomeric electrode with an LED connection before and after the application of 700% strain.

As shown in FIG. 16, a helical-structured elastomeric electrode was prepared in the same manner as in Experimental Example 1, except that helical-structured PDMS fibers (with a helix angle of 20° and a pitch of 2.5 mm) were used instead of 2D PDMS plates. The helical-structured elastomeric electrode could be stretched by ≈700%, accompanied by an increase in resistance from 0.7 to 6.5 Ω/cm. The previously reported prestretching process has much difficulty in being directly applied to the large-area and/or curve-shaped elastomers, whereas the approach of the present invention can also be applied to fabricate elastomeric conductors with various shapes, such as intaglio or embossed PDMS.

6. Peeling Tests on Elastomeric Electrodes

The hierarchically wrinkled surface morphologies of the (TB-Au NP/TA)$_n$ multibilayer-coated PDMS substrate impart remarkable stability of electrical conductivity against external stimuli. Conductive (TB-Au NP/TA)$_n$ multibilayers are deposited onto the entire surface, from the peaks to the valleys of the wrinkled PDMS.

Generally, conventional conductive materials can be easily detached from PDMS substrates owing to their low affinity to PDMS. In contrast, the wrinkled surfaces of PDMS—in addition to the stable covalent bonding between Au NPs and SH-PDMS, and between TA and Au NP—are highly advantageous for the maintenance of electrical conductivity under external mechanical stimuli.

Figure 17:
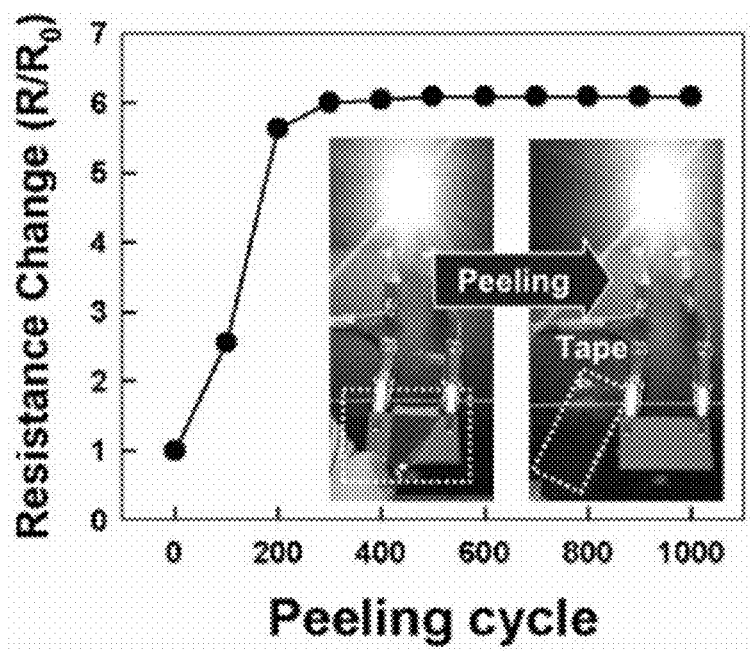
FIG. 17 shows a resistance change as a function of peeling cycle for a (TB-Au NP/TA)$_{15}$-PDMS elastomeric electrode (Experimental Example 6)
Figure 18:
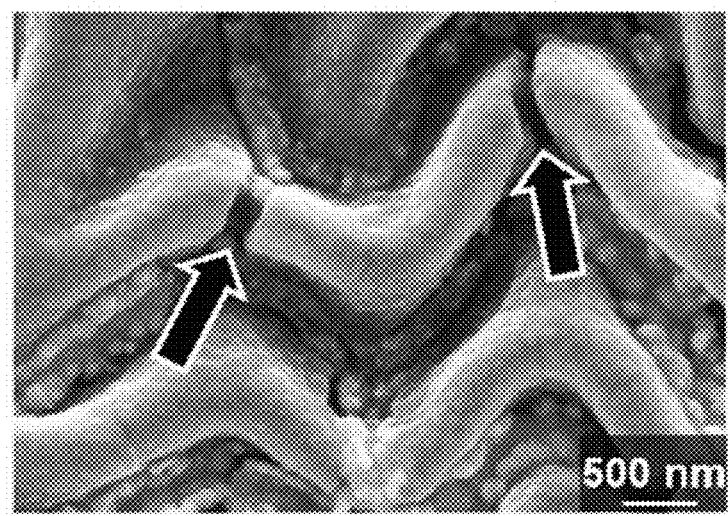
FIG. 18 is a field-emission scanning electron microscopy (FE-SEM) image of the (TB-Au NP/TA)$_{15}$-PDMS elastomeric electrode of FIG. 17 after 1000 peeling cycles.

To demonstrate this, peeling tests using scotch tape were performed on (TB-Au NP/TA)$_{15}$-coated PDMS substrates. FIG. 17 shows a resistance change as a function of peeling cycle for a (TB-Au NP/TA)$_{15}$-PDMS elastomeric electrode and FIG. 18 is a field-emission scanning electron microscopy (FE-SEM) image of the (TB-Au NP/TA)$_{15}$-PDMS elastomeric electrode of FIG. 17 after 1000 peeling cycles.

Repetitive peeling during 230 cycles increased the resistance due to the partial crack of Au NP multibilayers (see FIG. 17). However, after 230 cycles, no further resistance increase was observed because of the stable presence of (TB-Au NP/TA)$_{15}$ multibilayers in the valley regions of the wrinkled PDMS, and because of the stable covalent bonding at the SH-PDMS/Au NP and Au NP/TA interfaces (see FIG. 18). This demonstrates that the inventive elastomeric electrodes can maintain highly stable electrical conductivity under mechanical deformation. In addition to this stability arising from the wrinkled surface and the high affinity at the SH-PDMS/Au NP and Au NP/TA linker interfaces, it is believed that this is also enhanced by partial metallic fusion among the neighboring Au NPs.

7. Evaluation of Practicability of Elastomeric Electrodes

To further demonstrate the effectiveness and practicability of the inventive elastomeric electrodes, a triboelectric nanogenerator (TENG) based on metal-like wrinkled elastomers was fabricated. TENG devices convert mechanical energy into electricity using the triboelectric effect coupled with electrostatic effects.

Generally, charge generation and transfer in TENG devices are induced by periodic contact and separation between different triboelectric materials.

Figure 19:
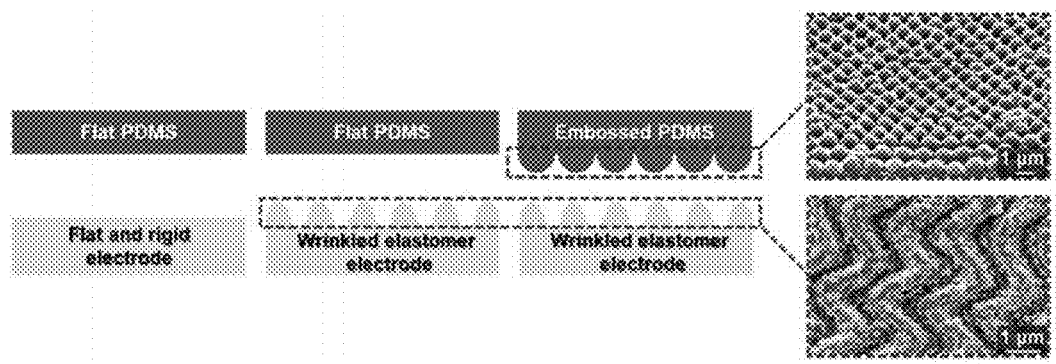
FIG. 19 is a diagram schematically illustrating triboelectric nanogenerator (TENG) devices with three different kinds of electrode (i.e., flat PDMS/rigid electrode, flat PDMS/elastomeric electrode, embossed PDMS/elastomeric electrode) (Experimental Example 7)

FIG. 19 is a diagram schematically illustrating triboelectric nanogenerator (TENG) devices with three different kinds of electrode (i.e., flat PDMS/rigid electrode, flat PDMS/elastomeric electrode, embossed PDMS/elastomeric electrode).

As shown in FIG. 19, the resultant elastomeric TENG was composed of the wrinkled elastomeric contact electrode with positive triboelectric polarity and a negative triboelectric PDMS film. For performance comparison, TENG devices with rigid and flat Au electrodes (i.e., Au-sputtered Si wafers) were also prepared. For the negative PDMS films, flat and embossed PDMS films were prepared.

Based on these triboelectric electrodes, the change in electrical output of a flat and rigid electrode-based TENG (i.e., flat PDMS/rigid electrode—TENG) and elastomeric electrode-based TENGs (i.e., flat PDMS/elastomeric electrode-TENG, and embossed PDMS/elastomeric electrode-TENG) was examined as a function of repeated compressive force at an applied frequency of 5 Hz with 20% relative humidity.

Figure 20:
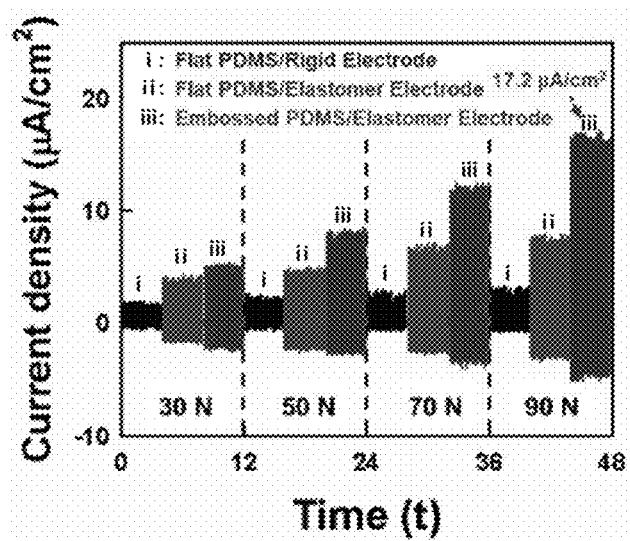
FIG. 20 shows current densities of the TENG devices of FIG. 19 for different compressive forces.
Figure 21:
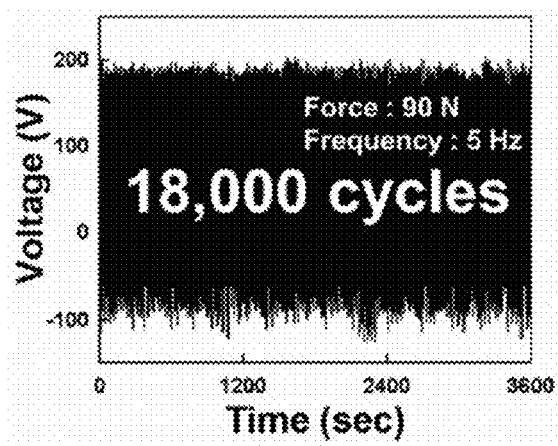
FIG. 21 shows the results of stability test on the embossed PDMS/elastomeric electrode-TENG device of FIG. 19.

FIG. 20 shows current densities of the TENG devices of FIG. 19 for different compressive forces and FIG. 21 shows the results of stability test on the embossed PDMS/elastomeric electrode-TENG device of FIG. 19.

Referring to FIG. 20, when the flat PDMS/rigid electrode-TENGs were subjected to a pushing force of 30 N, the voltage and current output were ≈18 V and 2.0 µA/cm², respectively. As the compressive force was increased up to 90 N, these electrical outputs were also gradually increased up to ≈56 V and 3.4 µA/cm². However, in the case of flat PDMS/elastomeric electrode-TENGs, as the compressive force increased from 30 to 90 N, their electrical outputs were significantly increased from 53 V and 4.2 µA/cm² to 145 V and 8 µA/cm². In the case of the embossed PDMS/elastomeric electrode-TENG, its electrical output was significantly increased up to ≈198 V and 17.2 µA/cm² during 18,000 cycles (see FIG. 21).

Furthermore, resistors were connected as external loads to examine the effective power of the embossed PDMS/elastomeric electrode-TENG. With increasing load resistance, the instantaneous voltage peak was increased, whereas the current peak density was decreased owing to ohmic loss. Consequently, the instantaneous power output reached the maximum value (i.e., $W=I^2_{peak}R=11$ W/m²) at ≈10 MΩ. Thus, the embossed PDMS/elastomeric electrode-TENG could be considered as a current source with a large internal resistance when the external resistance load was considerably smaller than the internal resistance.

As a result, the TENG device using wrinkled elastomeric contact electrodes increases the contact area between compressible plates. That is, these plates readily deform each other and fill vacant spaces, leading to a larger contact area. This notably increases the electric outputs of elastomeric electrode-based TENG.

Figure 22:
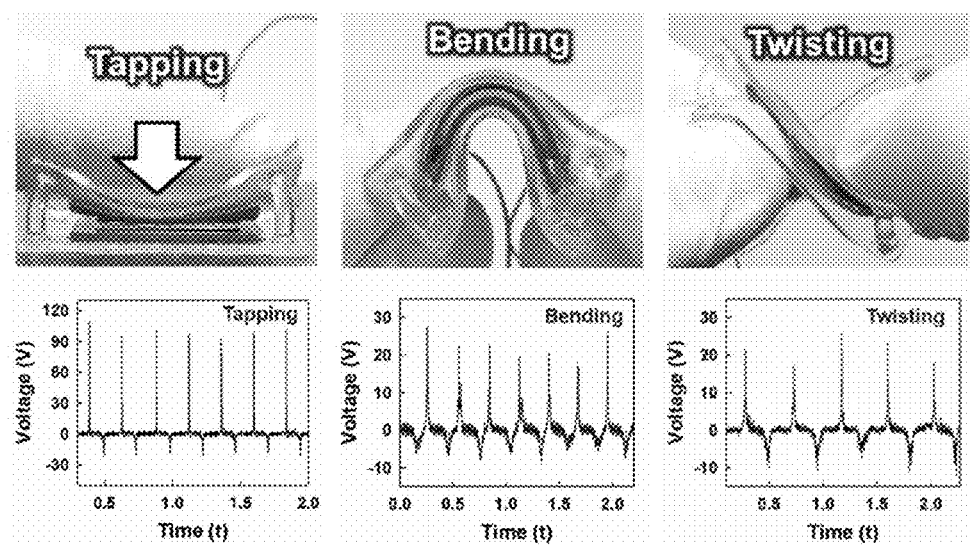
FIG. 22 shows photographs and output voltages of the PDMS/elastomeric electrode-TENG device of FIG. 19 under tapping, bending, and twisting.

The performance of TENGs was also measured under various types of deformation, such as tapping, bending, and twisting. FIG. 22 shows photographs and output voltages of the PDMS/elastomeric electrode-TENG device of FIG. 19 under tapping, bending, and twisting.

Because the inventive TENG was composed of only elastomers, it is freely deformable, and can generate power through repeated contact and separation between the elastomeric electrode and the embossed PDMS. Under finger tapping, bending, and twisting, the output voltage was ≈100, 25, and 20 V, respectively. The stable power generation of the TENG under these deformations is because the elastomeric electrode can maintain high electrical conductivity under high strain and repeated contact and separation.

Although the present invention has been described herein with reference to the specific embodiments, these embodiments do not serve to limit the invention and are set forth for illustrative purposes. It will be apparent to those skilled in the art that modifications and improvements can be made without departing from the spirit and scope of the invention.

Such simple modifications and improvements of the present invention belong to the scope of the present invention, and the specific scope of the present invention will be clearly defined by the appended claims.

What is claimed is:

1. A method for preparing an elastomeric electrode, comprising (a) dipping a stretchable substrate into a first dispersion comprising metal nanoparticles dispersed in a first organic solvent to swell the substrate and form a metal nanoparticle layer on the swollen substrate and (b) dipping the swollen substrate formed with the metal nanoparticle layer into a second dispersion comprising a monomolecular material having one or more amine groups (—NH$_2$) dispersed in a second organic solvent to form a monomolecular layer on the metal nanoparticle layer and contract the substrate, leaving wrinkles on the surface of a bilayer consisting of the metal nanoparticle layer and the monomolecular layer deposited onto the metal nanoparticle layer, wherein the first organic solvent swells the stretchable substrate when the metal nanoparticles are coated on the stretchable substrate to form the metal nanoparticle layer, and wherein the second organic solvent is different from the first organic solvent and contracts the swollen substrate when the monomolecular material is coated on the metal nanoparticle layer to form the monomolecular layer.

2. The method according to claim 1, wherein the substrate is a poly(dimethylsiloxane) (PDMS) substrate, the first organic solvent comprises toluene, and the second organic solvent comprises ethanol.

3. The method according to claim 1, wherein steps (a) and (b) are sequentially repeated a plurality of times to deposit a plurality of bilayers.

* * * * *